(12) United States Patent
Margolis

(10) Patent No.: US 7,551,025 B2
(45) Date of Patent: Jun. 23, 2009

(54) HIGH-VOLTAGE TRANSCONDUCTANCE CIRCUIT

(76) Inventor: Mitchell E. Margolis, 16169 Sunset Blvd, #304, Pacific Palisades, CA (US) 90272

(*) Notice: Subject to any disclaimer, the term of this patent is extended or adjusted under 35 U.S.C. 154(b) by 5 days.

(21) Appl. No.: 11/846,923

(22) Filed: Aug. 29, 2007

(65) Prior Publication Data

US 2009/0058530 A1   Mar. 5, 2009

(51) Int. Cl.
*H03G 5/16* (2006.01)
(52) U.S. Cl. ........................... 330/133; 330/310
(58) Field of Classification Search ............. 330/133, 330/310, 150, 98
See application file for complete search history.

(56) References Cited
U.S. PATENT DOCUMENTS 4,001,697 A * 1/1977 Withers et al. .............. 327/104
4,456,390 A * 6/1984 Junkert et al. .............. 374/128
6,473,595 B1 * 10/2002 Kim et al. .................. 455/63.1

* cited by examiner

*Primary Examiner*—Henry K Choe
(74) *Attorney, Agent, or Firm*—Robert E. Malm

(57) ABSTRACT

The invention is a high-power transconductance circuit (HVTC) comprising three direct-coupled stages which can be substituted for a final-stage power-amplifying vacuum tube in an audio amplifier. The HVTC consists of an input stage, a driver stage, an output stage, and a power conditioner. The input to the HVTC is a composite signal consisting of an AC component and a DC component. The input stage conditions the input composite signal for input to the driver stage. The driver stage transforms the input composite signal into the driving signal for the output stage. The output stage utilizes one or more power transistors to drive a load. The power conditioner supplies regulated power to the HVTC. The input composite signal is direct-coupled through the input stage and the driver stage to the output stage.

21 Claims, 4 Drawing Sheets

EIA base 7AC, 1 & 6 = NC

HIGH-VOLTAGE TRANSCONDUCTANCE CIRCUIT

BACKGROUND OF THE INVENTION

A forerunner of applicant's invention is Pritchard's "Solid State Emulation of Vacuum Tube Audio Power Amplifiers" (U.S. Pat. No. 5,636,284). Pritchard describes the audio power amplifier prior art in terms of a typical configuration consisting of two triodes which form a differential amplifier phase splitter which drive two pentodes connected through a transformer to a speaker and a circuit providing feedback to the triode inputs.

Prichard identifies six features of this tube circuit of importance in emulating its performance with solid-state devices. The first feature is a bias-shifting capability of the input circuit which contributes the swirl of timbre of a decaying musical note.

The second feature has to do with the grid conduction of the pentodes which are driven by the high-impedance triode drivers. The grid conductance and the high-impedance drivers limits the drive capability of the pentodes at zero grid voltage which is particularly important when considering the variation of load lines.

The third feature has to do with the screen grids modulating the pentode current and causing a drop in the screen voltages. The screen voltage drop lowers the transconductance or gain of the pentodes producing the compression associated with tube circuits.

The fourth feature has to do with the slope of tube plate current versus grid voltage always increasing which results in ever-increasing distortion without clipping resulting in low-level signals being essentially distortion free and higher-level signals being distorted. If one wishes to maintain the classic tone, this distortion must be preserved because it blends into the clipping distortion.

The fifth feature has to do with the cathode biasing in lower-power amplifiers which has an effect similar to the compressive action of the screen-voltage variation but at much shorter time constants.

The sixth feature has to do with the character of the plate curves as altered by the screen resistors. A large round knee produces a softer clip than a sharp knee.

The object of Pritchard's invention was a solid-state amplifier which had the same six features as tube-type audio amplifiers.

The Pritchard invention incorporates a variety of distortion-producing elements into and around linear systems to produce tube-like "effects". The embodiment shown in Pritchard's FIG. 4 is a good example. A linear power amplifier 46 of any convenient class or topology is shown surrounded by the embellishments needed to produce the desired result. The problem with this approach is that the many non-linearities are a challenge to control when attempting to exploit them in mass-produced equipments.

An important need left unsatisfied by Pritchard's invention is a plug-in solid-state module for expendable vacuum tubes which would provide a means for extending the lifetimes of existing tube amplifiers. In order to keep using their existing tube amplifiers as conventional vacuum tube audio power pentodes become less available, audio amplifier users will be forced to either retire the equipment, or make the change to a satisfactory vacuum tube substitute module.

Pritchard's solution is an all-new, non-modular, all-transistorized audio amplifier which mimics the performance of a tube-type audio amplifier. Pritchard's approach cannot be used to create a modular stand-alone power pentode substitute, and will not preserve the existing gear for the end user. Pritchard's approach doesn't solve their problem of finding an individual or set of replacement power output tube(s) or substitute modules for existing audio amplifiers.

The primary object of the present invention is to satisfy the need for robust and reliable vacuum pentode substitutes by vacuum-tube amplifier designers and end users. This situation has developed due to the dwindling number of good-quality receiving-tube manufacturers across the globe.

A second object is to provide a pentode substitute which meets or exceeds the pertinent electrical specifications of the target audio output pentode.

These objects are achieved by addressing the following deficiencies in the vacuum pentode output device art:

The necessity for a heater and high-temperature electron emitter structure and the slow exhaustion over time of the emitting surface of the vacuum tube's cathode;

The instabilities of the input bias voltage and currents resulting from vacuum failure or contamination mechanisms that corrupt or otherwise disturb a pentode's electrical operation;

The limited maximum signal current flow capability of conventional vacuum tube audio pentodes leading to the limiting of peak signal events and noticeably reduced dynamic sonic expression for the end users;

The high plate-to-cathode impedance of power-output vacuum tubes which limits the ability to drive output transformers and the tube-type amplifier's dynamic range and bandwidth;

The impossibility of adjusting the transconductance of vacuum pentodes at time of manufacture once the tube element assemblies are installed in their glass housings thereby preventing dynamic current matching of pentode pairs or multiples of pairs;

The impossibility of adjusting the input bias voltage sensitivity of vacuum pentodes at time of manufacture once the tube element assemblies are installed in their glass housings thereby preventing fine static current matching of pairs or multiples of pairs of vacuum pentodes;

The inalterability of the warm-up interval of 11 seconds for most vacuum output pentodes;

The necessity for the host amplifier to supply filament current thereby resulting in hotter running amplifier power supplies, and higher radiated hum fields.

BRIEF SUMMARY OF THE INVENTION

The invention is a high-power transconductance circuit (HVTC) comprising three direct-coupled stages which can be substituted for a final-stage power-amplifying vacuum tube in an audio amplifier. The HVTC consists of an input stage, a driver stage, an output stage, and a power conditioner. The input to the HVTC is a composite signal consisting of an AC component and a DC component.

The input stage conditions the input composite signal for input to the driver stage. The driver stage transforms the input composite signal into the driving signal for the output stage. The output stage utilizes one or more power transistors to drive a load. The power conditioner supplies regulated power to the HVTC.

The input composite signal is direct-coupled through the input stage and the driver stage to the output stage.

DETAILED DESCRIPTION OF THE INVENTION

Figure 1:
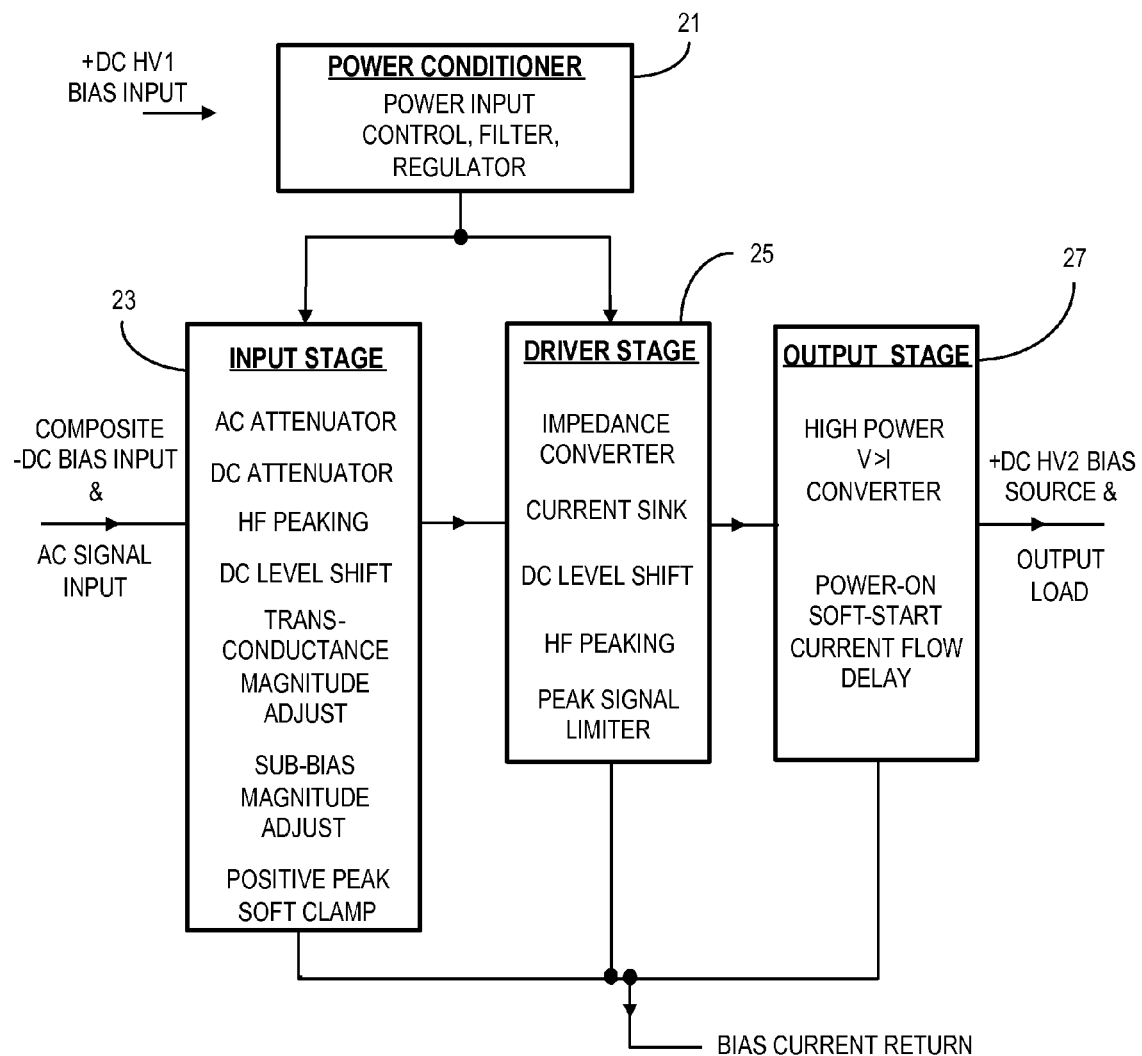
FIG. 1 is a functional block diagram of the high-voltage transconductance circuit.

The invention is a semiconductor-based alternative for popular audio power pentode vacuum tubes intended for low frequency applications. Pentode vacuum tubes may correctly be considered as high-voltage transconductance devices in that voltage fluctuations at the input terminals produce current fluctuations at the output terminals which are subject to high voltage potentials. The vacuum tube pentode consists of a thermionic electron source surrounded by a carefully designed and positioned set of conductive concentric electrode elements. The pentode elements working in concert establish the pentode's electrical characteristics.

The invention is also a high-voltage transconductance device that employs transistors and other semiconductors, rather then electrical elements housed within an evacuated vessel. It is designed to have improved pentode response characteristics through the use of semiconductor devices made available by recent developments in the semiconductor field.

The invention will hereinafter be referred to as the High-Voltage Transconductance Circuit or HVTC. The HVTC may be substituted for a pentode vacuum tube in an existing audio amplifier ("host amplifier") or incorporated in newly-designed audio amplifiers to perform the same function that a pentode vacuum tube might perform.

There are many possible applications for the invention. One key application is to supply end users with a "bridging" component that can be used in an existing audio amplifier, to close an otherwise open signal path within the host amplifier, and complete the delivery of the augmented input signal to the output load in a satisfactory manner.

Being a high-voltage transconductance device, the HVTC is not, in itself, a complete audio amplifier, and relies on surrounding circuitry for proper performance, as would the original pentode it displaces. In addition, the HVTC may be used in new audio amplifier designs as a distinct module or incorporated in the audio amplifier as part of the circuitry. This approach would eliminate the need for certain vacuum tube support components such as tube plugs and sockets, resulting in reduced manufacturing and maintenance costs.

The HVTC is aimed at, but not limited to, displacing many popular vacuum tube types that may be found in existing complete audio amplifiers. Examples would be the 6V6, 6L6, KT-66, 77 and 88, the 6550 and type EL-34/6CA7, and can include many more depending on demand. The HVTC is configured so as to furnish improved life span and signal handling capabilities over the original audio power output pentode it replaces. It is also designed such that the dynamic characteristics, particularly the input and output parameters, are congruent to the vacuum pentode it is displacing. The HVTC is especially suited for driving complex loads, such as an output transformer and loudspeaker. How this is accomplished may be seen in the details provided below.

Whatever the target tubes type's electrical characteristics are, the HVTC's many embodiments may be built into newly designed electronic equipment as a free aggregate of components. Alternatively, the HVTC may be assembled into a suitable housing, fitted with an appropriate tube plug or base, and installed like a replacement vacuum tube into existing DC or audio amplifiers. In either case, the HVTC is best used as a modular or component part of a larger design, as for example, in existing vacuum-tube audio amplifiers, or as a part of an entirely new audio amplifier design.

The HVTC's circuit elements may be changed slightly to better reflect the electrical characteristics of different vacuum pentodes. For example, larger N-channel output MOSFETs with higher power dissipation and voltage ratings may be employed to better fit circuits using the largest audio power pentodes such as types KT-88, EL34 or 6550. Correspondingly, smaller MOSFETs may be used for circuits originally designed for the more modest pentodes such as types 6V6 or 6BQ5/EL84. The invention's basic circuits and functions as defined in the figures that follow remain the same.

The HVTC is not a complex multi-stage effects amplifier, or artificial-distortion negative-feedback, self-gain-modulating amplifier system, but is instead an improvement over the existing vacuum-tube-as-transconductance-module art. As such, the HVTC can be sued in many applications inside and outside the realm of audio amplification since it is not a tube-tone emulator system. Indeed, the HVTC is merely an electrical component or module, like the vacuum pentode it displaces, and could, for example, be used in a high-voltage power supply as a linear voltage regulator, or in a low-power, low-frequency RF transmitter or oscillator application. These applications would be impossibilities for a tube-tone emulator amplifier or other complete but otherwise closed audio amplifier systems.

The preferred embodiment of the HVTC consists of the four functional blocks shown in FIG. 1.

The power conditioner 21 provides a regulated voltage where required in the HVTC. In the embodiment for use in a host amplifier, the current needed to create the regulated voltage is received through the host amplifier's screen-electrode power source. The host amplifier's high-voltage screen power source is typically connected to the screen electrode through a resistance ranging in size from a few hundred to a few thousand ohms. The power conditioner 21 reduces and regulates the high voltage down to a regulated and filtered 18-volt bus.

Noise filtering is accomplished by AC coupling of the 18-volt bus to signal ground and the use of generously-sized shunt capacitors thereby ensuring an 18-volt supply bus free of Zener regulator diode noise or other noises from the host amplifier.

In new amplifier designs, power conditioner 21 may receive its input power from fixed voltage sources that may be present in, or added to the equipment being designed. The power conditioner can accommodate input voltages from 18 to 600 volts by simply changing the value and power rating of the conditioner's input voltage dropping resistor.

Input stage 23 performs many critical functions simultaneously, related to the conversion and preparation of the composite input signal for delivery to the driver stage. The structure of the composite input signal in a host amplifier is specifically configured to drive a conventional pentode vacuum tube. This signal consists of a resistively mixed set of voltages consisting of a negative DC "bias" voltage and an AC signal confined to a specified band of frequencies.

The "bias" voltage may range in amplitude from −6 to −72 volts, depending on the pentode vacuum tube used in the host amplifier's power output circuits. The bias voltage is typically supplied through a high-value resistor, whose resistance typically ranges from 47,000 to 470,000 ohms. Only a few microamperes of the bias current is needed to control the pentode's output current or the output current of the HVTC.

The AC signal is typically supplied by a preceding stage in the host amplifier and fluctuates about a baseline voltage established by the negative bias voltage. The AC signal may range from zero to 150 volts peak-to-peak depending on the circuitry of the preceding stage and the voltage-drive requirements of the target pentode tube type being displaced.

Input stage 23 reduces the magnitudes of the DC bias voltage and the AC signal by a prescribed factor which depends on the target tube type. This is accomplished by a resistor-based voltage divider having two fixed elements and one adjustable element. The adjustable element provides a means for varying the HVTC transconductance, i.e. voltage-in-current-out characteristic, over a 2:1 range. This is important when matching response or sensitivity of the HVTC during testing since it allows very uniform behavior to be "dialed in" at the time of manufacture, something not at all practical with conventional vacuum pentodes. In addition to matching, the adjustable element permits sweeping the sensitivity over a broad enough range to cover a small group of target vacuum pentodes whose transconductance characteristics are of similar value without changing any other HVTC fixed circuit elements.

Another resistor-based voltage divider having two fixed elements and one adjustable element performs the necessary DC bias voltage level-shifting. Driver stage 25 requires that the maximum input signal voltages to input stage 23 range from −18 to +18 volts contrasted with the 0 to −72 volts typically found in a host amplifier.

The DC level-shifting circuitry lifts the now attenuated composite input signal voltage to the correct DC value for inputting to driver stage 25. This circuitry also serves to adjust the bias-voltage quiescent value to match that of the target vacuum tube type.

The input-stage 23, the driver stage 25, and the output stage 27 of the HVTC constitute a direct-coupled amplifier which has a frequency response extending from zero frequency to some upper limit. The zero-frequency capability results from not using capacitive or transformer coupling within or between stages. Since the HVTC uses direct coupling throughout, the HVTC boasts the same low-frequency stability as the displaced vacuum tube when used in a host amplifier. It also ensures that any DC bias-voltage adjustment facilities in the host amplifier will continue to function normally.

Finally, small-value capacitors of a few picofarads may be applied as high-frequency shunt elements placed across certain attenuator resistors for altering the high frequency response of the HVTC as needed.

After passing through input stage 23, the large negative DC bias voltage will have been shifted from the −6 to −72 volt range to a range of +1 to +3 volts. The AC signal will have been reduced by 10 to 20 dB or three to ten times.

Driver stage 25 is so named as it's most important function is to reinforce the delicate reconditioned input signal in order to effectively drive output stage 27. The composite signal after passing through input stage 23 is attenuated and level-shifted to the correct voltage magnitude for driving driver stage 25. This fragile signal from input stage 23 is inputted to driver stage 25 where a new group of critical functions are performed simultaneously.

First, the driver stage 25 produces the necessary power gain by transforming the source impedance of the attenuated composite signal from a very high 3 mega ohms down to a more useful 2 kilo ohms or lower. Driver stage 25 preserves the rise- and fall-time symmetry of the output stage and governs the quiescent current flow through the stage.

Driver stage 25 also shifts the DC level of the now reinforced composite signal. This reinforcing is important since output stage 27 utilizes an enhancement-mode MOSFET and the MOSFET gate voltage must be higher then the drain voltage before conduction begins. But the MOSFET gate voltage should not be so high as to be a danger to the gate insulation of the MOSFET. To that end, the driver stage can only furnish a peak signal output voltage of 18 volts which is below the 20-volt limit published by the MOSFET's manufacturer. The peak output limit is set by the fact that driver stage 25 is operating off of power conditioner 21's 18-volt supply.

Driver stage 25 also isolates or "screens" the input signal from the large gate input capacitance of output stage 27. As vacuum tube amplifying devices evolved from their origins into triodes, designers confronted fairly severe bandwidth and high frequency limitations. The primary frequency response limitation resulted from the coupling of counter-polarity signals between the triode's input control grid and the output anode terminal. The coupling happens through a parasitic capacitive interaction between the input (grid) and output (plate) electrodes, and since these electrodes are constructed concentrically, they form a loosely coupled capacitor. When the plates of any capacitor undergo voltage changes relative to one another, currents will flow between them. The amount of capacitance is not very large, but it becomes a voltage gain spoiler at high frequencies and/or high gain. At high frequencies, parasitic gain-canceling currents begin to flow through the parasitic capacitance, or what's called the Miller capacitance. Differential voltage across the capacitance is assured due to the counter-phase nature of the input and output signals. The creation of counter-phase signal components is attributable to the polarity inversion imposed upon the amplified signal by the triode configured in the standard voltage-gain circuit, sometimes referred to as a common-anode voltage gain stage. When these conditions are in place, a frequency dependent input-signal-canceling current will flow. The Miller capacitance seen at the control grid of the triode is essentially the gain of the tube in-circuit multiplied by the parasitic capacitance present between the control grid and the anode. Hence the static input grid-to-plate capacitance of a common triode, such as the 12AX7, may be only 5 picofarads, but in a circuit configured for a gain of 40, this becomes 200 picofarads, which can dramatically reduce the high frequency response of the amplifier stage depending on circuit details.

The key method that the vacuum tube designers had to cut down the parasitic capacitance was to install a concentric electrical isolation electrode between the control grid and the anode. It turns out that a loosely-constructed new electrode called a screen grid, with big spaces between it's wires to let most of the electrons through, could greatly reduce this capacitance, by electrostatically shielding or "screening" the input grid and output plate from one another. The degree of cancellation of the Miller capacitance was very effective, and improvements in device bandwidth proved to be spectacular. Signals reaching the control grid were no longer subject to unwieldy and unpredictable amounts of parasitic capacitive loading. To this day there are many pentodes whose gain-bandwidth products have yet to be matched by modern semiconductor devices.

The HVTC does not screen it's input from the output by direct electrostatic means but instead through the isolating or "screening" nature of driver stage 25. Driver stage 25 operates off of the power intended for the vacuum pentode's screen electrode and ends up performing, among the many other things already listed, the equivalent screening or isolation function that the old screen electrode did. Through the presence of driver stage 25, the output stage anode or control gate voltage fluctuations are effectively stopped from directly interact with the much smaller counter-phase conditioned input signal. Moreover, this isolation function occurs with very little of the electrical drama that the actual screen electrode undergoes in the vacuum pentode. In the pentode, the screen current can fluctuate abruptly with anode voltage and is in general extremely non-ohmic or non-linear in behavior as may be seen in the dashed line screen current curves on the left hand side of FIG. 2. Vacuum tube designers tried their best to tame the screen's non-ohmic characteristics by carefully winding the concentric screen grid to be in the electron shadow of the inner control grid, but could only go so far. By contrast, the "screen" load that the HVTC presents to the host amplifier is almost completely resistive and does not change with anode (drain) voltage at all, unless the screen supply voltage changes.

Here also (like input stage 23), small-value capacitors of a few picofarads may be applied as high frequency shunt elements placed across certain driver stage resistors, for altering the high frequency response of the HVTC as needed.

Figure 2:
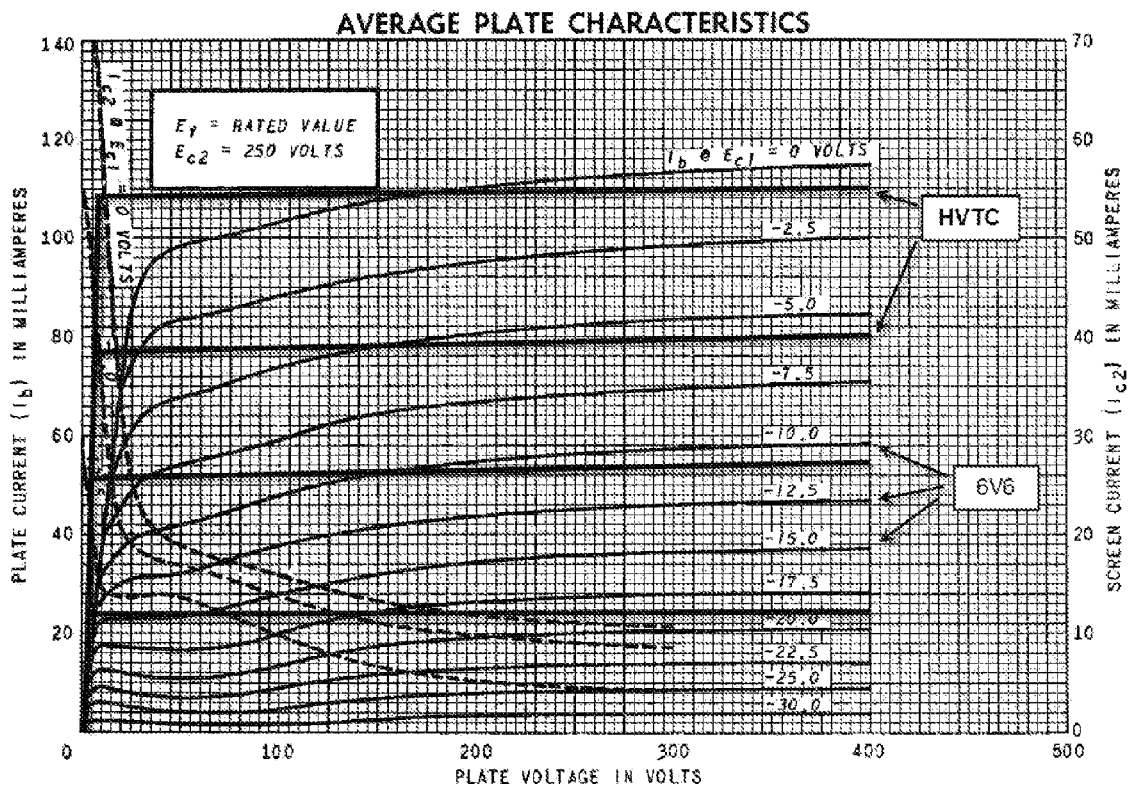
FIG. 2 shows plate current vs. plate voltage for various grid voltages for the 6V6 vacuum tube and the corresponding curves for the high-voltage transconductance circuit.

Output stage 27 converts the AC signal supplied by driver stage 25 from a fluctuating voltage to a fluctuating current and the original DC bias voltage is reproduced as a small quiescent or standing bias current. The voltage-to-current conversion occurs in a high-voltage N-channel MOSFET output device whose drain voltage vs. drain current characteristic is very close to that of the vacuum pentode as shown in FIG. 2. The MOSFET characteristics are in fact an improvement over those of the vacuum pentode with sharper curve "knees" and a flatter near-ideal family of "plate" or drain behavior. Ideal curves would be perfectly square, with a vertical current rise at 0 volts, and a horizontal traversal (zero slope) across the "plate" or drain voltage span.

Visual information about a certain type of vacuum pentode including the means of determining the transconductance of the pentode is provided in FIG. 2. Graphical and tabular data of this sort has been produced for each vacuum pentode type by their respective manufacturers for many years. This information is used to configure the target transconductance of output stage 27.

The MOSFET device has a rated transconductance of many hundreds to several thousand times that of the vacuum pentode it is displacing. Excess transconductance is reduced by selecting the correct value of source resistor, which scales down the high power voltage-to-current conversion process to the proper magnitude. Thus, by trimming the input-stage attenuator and properly selecting the power MOSFET's source resistor, the correct value of transconductance may be achieved by the HVTC for a given type of target vacuum pentode.

Another function performed by output stage 27 is a power-on current flow delay. This function serves to hold off current flow through the output-stage power MOSFET until a prescribed period of time has elapsed, whereafter the MOSFET current flow ramps up gently. The result is a muting of any turn-on transients. The delay period can be programmed at the time of manufacture and may be different from the "warm-up" time of the displaced vacuum pentode's fixed 11-second delay. The delay may be omitted if instant-on behavior is desired.

Finally, the power MOSFET of output stage 27 is subject to the same joule-heating effects in it's drain circuit as in the vacuum pentode's plate circuit. The MOSFET is, therefore, affixed to a suitable heat sink to control the temperature rise.

The HVTC may be configured as a permanently mounted feature within a newly designed amplifier. Manufacturers may see the elimination of plugs, sockets and wiring expenses as a clear advancement in the art as well.

Figure 3:
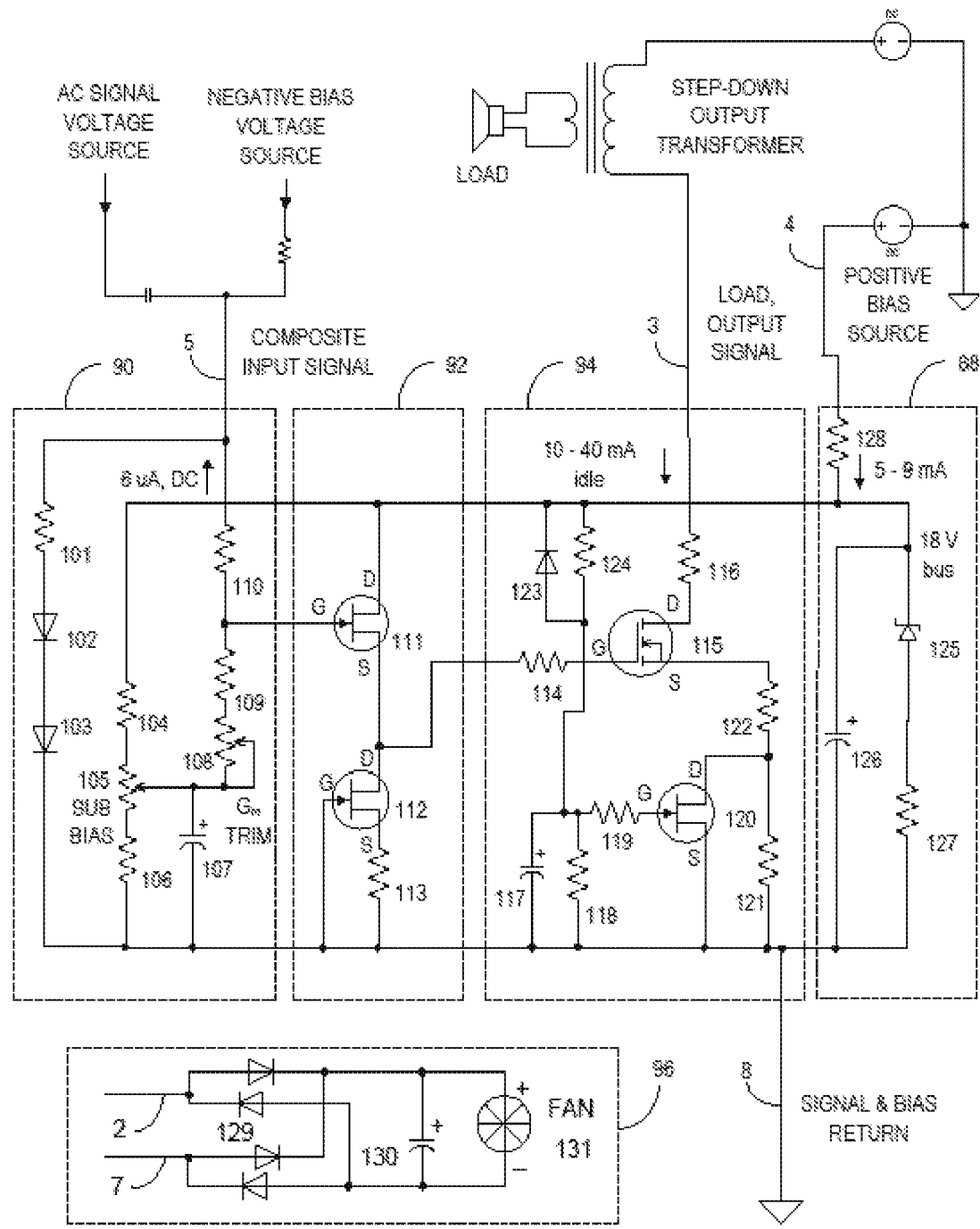
FIG. 3 is the circuit diagram for the preferred embodiment of the high-voltage transconductance circuit.

A preferred embodiment of the invention is shown in FIG. 3. It consists of four stages: namely, power conditioner 88, input stage 90; driver stage 92. and output stage 94 together with cooling fan circuitry 96 if such is required. The cooling fan circuitry 96 does not interact with the other stages of the preferred embodiment.

Power conditioner 88 provides a stable low voltage (~18 volts) to low-voltage supply bus 129 thereby ensuring a stable reference voltage for the functions performed by the input stage 90 and the driver stage 92. This voltage is chosen specifically to ensure that the gate-to-drain voltage applied to MOSFET 115 never exceeds the rated maximum of 20 volts, and to provide enough signal voltage leeway to drive the preferred embodiment into full saturation in the host amplifier.

The HVTC puts the screen power required by the vacuum pentode being displaced to good use. This power enters at circuit point 4 and is channeled to power conditioner 88. The conventional vacuum pentode must have this high-voltage low-source-impedance supply present on the screen electrode or the pentode functionality will be compromised or lost altogether.

Creators of new power amplifier systems may have a low voltage supply rail available in their new designs thus obviating the need to tap supply current from a high voltage power supply channel to create a small low voltage source.

Input stage 90 performs three key functions which act on the input signal, and condition it for the following stages. The composite input signal consists of an AC component which may range up to 150 volts peak-to-peak and a negative DC bias voltage component which may range from −12 to −72 volts DC depending on the host amplifier. This composite input signal is applied at point 5 and ground-referenced to the signal and bias return voltage present at point 8.

The composite input signal is clamped to a maximum positive voltage of 1.3 volts through the action of resistor 101 and signal diodes 102 and 103 thereby preserving the input overdrive behavior of the original audio pentode and the circuitry driving the pentode. The AC portion of the input signal must exceed the negative DC bias by 1.3 volts in order for the clamp to be activated.

The composite input signal must be attenuated to match the drive voltage requirements of driver stage 92. Resistors 108, 109 and 110, along with capacitor 107 serve to reduce the input signal magnitudes by 10 to 20 dB, or 3 to 10 times. The degree of attenuation depends on the characteristics of the particular audio-output pentode being targeted for displacement.

The attenuated input signal must then be level-shifted in order to fall within the input operating voltage requirements of driver stage 92. This is accomplished by the adjustable sub-bias resistor network 104, 105 and 106. The adjustable tap of resistor 105 permits setting the circuit to match the control bias magnitude requirements of a given output pentode and host audio amplifier. It also permits easy and precise bias-threshold matching of pairs or multiple pairs of HVTC's as part of the manufacturing process, since great quantities of existing host audio amplifier equipment can benefit from such capabilities.

The attenuation may be trimmed for correct magnitude based on the target tube characteristics and for precise transconductance matching to the target tube and host audio amplifier requirements. The HVTC's native ability to adjust these parameters, formerly impossible to accomplish with finished conventional vacuum tubes, places the HVTC in territory that no conventional audio power vacuum tube can reach.

Driver stage 92 is comprised of components intended to provide unity voltage gain, interstage isolation, and more importantly, high-to-low signal impedance conversion. These components may take on many forms: e.g. op-amps, bipolar transistors, and MOSFETs.

The embodiment of FIG. 3 shows the use of two N-channel J-FETs 111 and 112, in a totem-pole configuration to perform the function of impedance conversion. They greatly magnify the conditioned input AC signal's power level, and are thus able to properly drive MOSFET 115 in output stage 94. Resistor 113 and J-FET 112 form an active current sink, and sets the quiescent operating current flowing through the stage. This configuration provides active pull-down action for quick draining of the MOSFET 115's gate charge when the input voltage fluctuates. This ensures good rise and fall time symmetry.

The components and current flow present in this stage can be reconfigured so the drive capabilities best match the specific model of N-channel power MOSFET 115.

Using high-input-sensitivity components in driver stage 92 is important in order to minimize the parasitic AC and DC load burdens on the conditioned input signal.

Output stage 94 consists of a power N-channel MOSFET 115 and an output-current-delay control circuit.

The output-current-delay control circuit consisting of N-channel MOSFET 120, diode 123, capacitor 117 and resistors 118, 119 and 124 serve to inhibit current flow through output MOSFET 115 for a period of a few seconds after power is applied to circuit point 4. This delay is included as a courtesy to users and masks any loud or dangerous turn-on transients that may otherwise be delivered to the output transformer and loudspeaker load. The delay may be configured to exist for any practical length of time, and may be programmed during manufacture of the high-voltage transconductance module. Altering this "warm-up" delay time beyond a few percent of the stock period of 11 seconds would be impossible with conventional vacuum tubes.

The N-channel MOSFET 115 and the vacuum tube which it displaces share key native anode (drain or plate) characteristics. Both share the same anode I vs. V electrical characteristics, with any difference being that the MOSFET has better, or more ideal pentode behavior then the tube it is replacing, as shown in FIG. 2. The MOSFET's I vs. V curve sets are squarer and more linearly spaced then those in the vacuum tube implying greater linearity, higher drain impedance, greater maximum voltage swing, and potentially lower distortion depending on the nature of the load arrangements.

MOSFET 115 is intrinsically rated to hold off or otherwise withstand source-drain voltages of 1000 to 1200 volts, depending on device model—higher then some of the displaced vacuum tubes such as the 6V6. This results in the HVTC being safe to use in applications where the output voltage swing across MOSFET 115 will include not only regular linear operation but also operational regimes of heavy clipping. This is important when driving inductive loads, since peak voltage or current response across the output transformer windings can momentarily exceed the V/I supply capabilities of the devices driving it.

MOSFET 115 also features transconductance ratings hundreds to thousands of times greater then the vacuum tube it displaces. The 6V6 type tube, for example, may exhibit a transconductance $g_m$ of 4 milliamps of current change per volt of input signal. A power MOSFET, however, can easily exhibit 4 Amperes current change per volt of input signal. To address this difference, the value of resistor 122 in the MOSFET source circuit is chosen to help scale the transconductance of the high-voltage transconductance module and have it match the value of the target vacuum tube type.

Resistor 122 also serves to stabilize the quiescent MOSFET 115 DC current fluctuations due to temperature changes, and to cap peak current output of the stage at a value of 200% of the target tube type. This expanded current capability permits much larger peak transient events to appear across the output transformer primary and the loudspeaker load as compared with conventional vacuum tube where such current excesses could result in damaging or depleting cathode materials.

Output signals from the drain of MOSFET 115 are directed through damping resistor 116, and return to the host amplifier through anode or plate point 3 for connection to the primary of the amplifier's output transformer.

The vacuum tubes replaced by the apparatus are capable of 12 to 50 watts of anode or plate dissipation. Therefore, MOSFET 15 must be fitted to a suitable heat sink. Space limitations in existing equipment can require that the heat sink be assisted by a modest DC operated cooling fan 131 in cooling fan circuit 96 mounted on or near the heat sink. A DC voltage is provided to the fan through a full-wave bridge rectifier 129 and smoothing filter capacitor 130. Fan power is developed through the use of the now superfluous vacuum tube filament supply furnished by the host amplifier at filament points 2 and 7.

Figure 4:
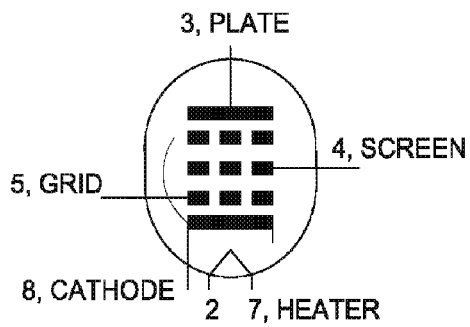
FIG. 4 shows the electrode connections for a vacuum tube which has an EIA base 7AC.

The HVTC is comprised of circuitry which may be housed in a heat-dissipating enclosure for instant installation in or removal from an existing vacuum tube based amplifier, or may exist as a stand-alone circuit assembly to be used in future amplifier designs. The correspondence between the circuit points 2, 3, 4, 5, 7, and 8 and the vacuum tube elements assuming EIA base 7AC (1 & 6=NC) are shown in FIG. 4.

To control manufacturing costs, the specific type and rating of MOSFET 115 are chosen to best fit the target pentode being displaced—MOSFETS with larger power and voltage handling capabilities for the largest audio pentodes and correspondingly lower specifications for the smaller pentodes.

Figure 5:
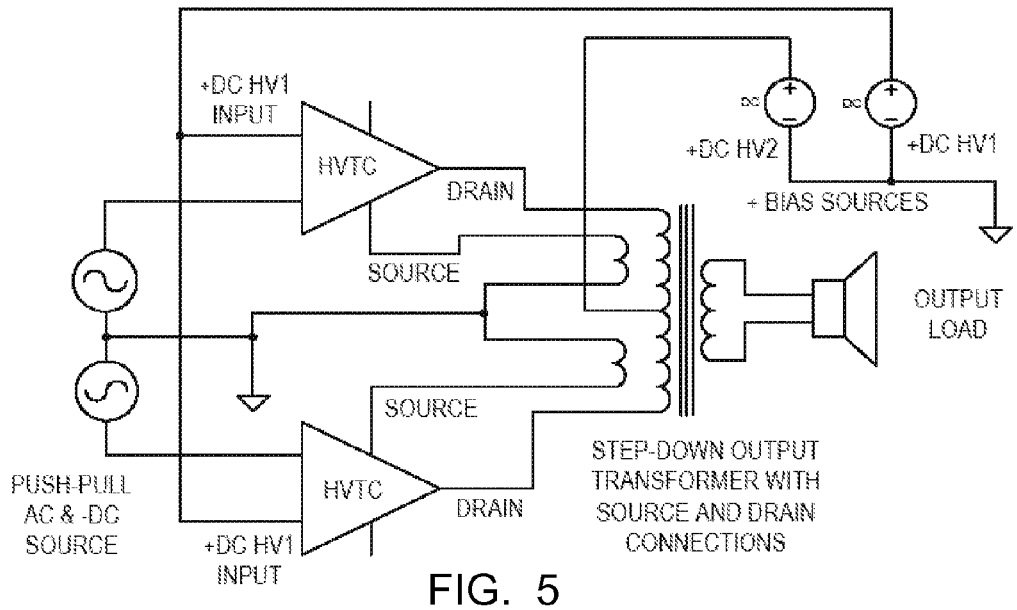
FIG. 5 shows the use of the high-voltage transconductance circuit in a push-pull class A or AB1 amplifier with drain and source connections to the output transformer.
Figure 6:
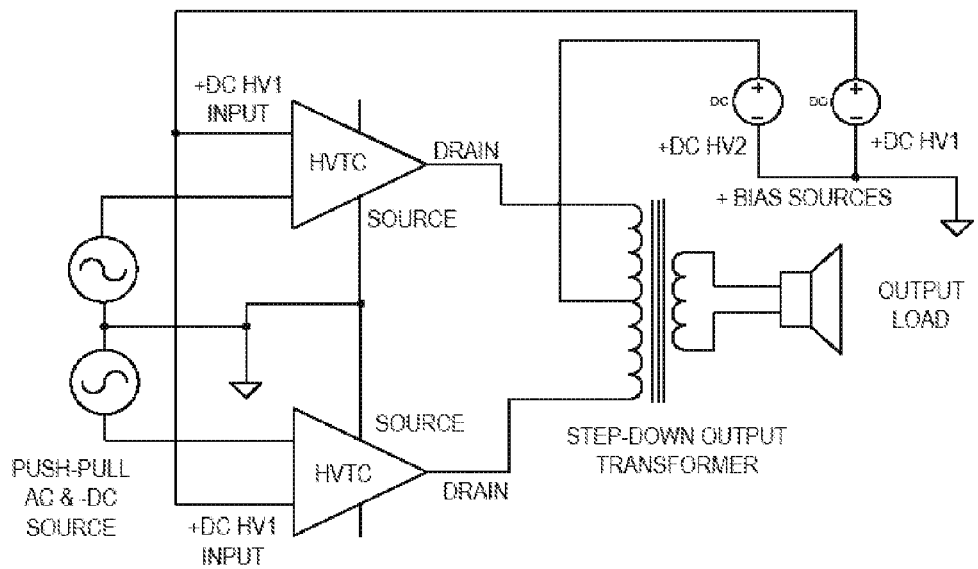
FIG. 6 shows the use of the high-voltage transconductance circuit in a push-pull class A or AB1 amplifier with drain connections to the output transformer.

The HVTC may be used in a single-ended capacity as described above or in push-pull arrangements. FIG. 5 shows the use of the HVTC in a push-pull class A or AB1 amplifier with drain and source connections to the output transformer. FIG. 6 shows the use of the HVTC in a push-pull class A or AB1 amplifier with drain connections to the output transformer.

What is claimed is:
1. A high-power transconductance circuit (HVTC) comprising three direct-coupled stages which can be substituted for a final-stage power-amplifying vacuum tube in an audio amplifier, the input to the HVTC being a composite signal consisting of an AC component and a DC component, the HVTC comprising:
an output stage which utilizes one or more power transistors to drive a load;
a driver stage which transforms an input signal consisting of an AC component and a DC component into a driving signal consisting of an AC component and a DC component for the output stage;

an input stage which conditions the input composite signal for input to the driver stage, the input composite signal being direct-coupled through the input stage and the driver stage to the output stage, the DC component of the composite signal being independent of the AC component; and a power conditioner for supplying regulated power to the HVTC.

2. The HVTC of claim 1 wherein the input stage includes a control element for adjusting the transconductance of the output stage.

3. The HVTC of claim 2 wherein the input composite signal feeds into a first resistor which is connected in series with a second resistor which connects to a DC voltage source, the signal appearing at the connection of the first and second resistors being the input signal to the driver stage, the second resistor being adjustable and corresponding to the control element for adjusting the transconductance of the output stage.

4. The HVTC of claim 1 wherein the transconductance of the output stage is adjusted by adjusting the magnitude of the composite signal supplied to the driver stage.

5. The HVTC of claim 1 wherein the input stage includes a clamping circuit for preserving the input overdrive behavior of audio amplifiers employing pentode vacuum tubes.

6. The HVTC of claim 5 wherein the clamping circuit is comprised of at least one diode connected in series with a resistor, the combination being connected between the input to the input stage and ground.

7. The HVTC of claim 1 wherein the input stage includes an attenuator for adjusting the magnitude of the composite signal to meet the drive voltage requirements of the driver stage.

8. The HVTC of claim 7 wherein the attenuator comprises a resistor divider net work in series with a capacitor.

9. The HVTC of claim 1 wherein the input stage includes a level-shifting control for adjusting the DC component of the attenuated composite signal to meet the input operating voltage requirements of the driver stage and the quiescent current flow requirements of the output stage.

10. The HVTC of claim 9 where level-shifting control is exercised with an adjustable tap of a resistor in a resistor network.

11. The HVTC of claim 1 wherein the driver stage converts the high-impedance input composite signal to a low-impedance output composite signal.

12. The HVTC of claim 11 wherein the driver stage utilizes two transistors in a totem-pole configuration to perform the impedance conversion function.

13. The HVTC of claim 1 wherein the driver stage limits the magnitude of the peak signal supplied to the output stage to a value less than a specified value.

14. The HVTC of claim 13 wherein the driver stage is powered by a voltage less than the specified value thereby limiting the peak signal supplied by the driver stage to the output stage.

15. The HVTC of claim 1 wherein the output stage includes an output current delay control circuit which inhibits the current flow through the one or more power transistors for a period of time after power is applied to the input stage and the driver stage.

16. The HVTC of claim 15 wherein the output current delay control circuit utilizes the short-circuiting of a resistor by means of a transistor switch to inhibit current flow through the one or more power transistors when power is applied to the input stage, the driver stage, and a resistor-capacitor network, the inhibit function being turned off when the capacitor is charged to a preset voltage.

17. The HVTC of claim 1 wherein the one or more power transistors are N-channel MOSFETs.

18. The HVTC of claim 17 wherein coarse adjustments of the transconductance of the HVTC are obtained by adjusting the value of a resistor in the source circuit of the N-channel MOSFETs.

19. The HVTC of claim 1 wherein all electrical connections to the HVTC are accomplished by means of a base which plugs into a vacuum-tube socket.

20. The HVTC of claim 19 wherein power is supplied to the power conditioner through the pin of the base corresponding to the screen terminal of the vacuum-tube socket.

21. The HVTC of claim 1 wherein the driver stage prevents voltage fluctuations occurring in the output stage from affecting the output signal from the input stage.

* * * * *